United States Patent
Yu et al.

(10) Patent No.: US 8,947,957 B2
(45) Date of Patent: Feb. 3, 2015

(54) BUILT-IN SELF REPAIR FOR MEMORY

(75) Inventors: Jiunn-Der Yu, Hsinchu (TW);
Tsung-Hsiung Li, Tucheng (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 390 days.

(21) Appl. No.: 12/887,926

(22) Filed: Sep. 22, 2010

(65) Prior Publication Data

US 2012/0069689 A1    Mar. 22, 2012

(51) Int. Cl.
 *G11C 29/12* (2006.01)
 *G06F 11/27* (2006.01)
 *G11C 29/44* (2006.01)
 *G11C 29/00* (2006.01)

(52) U.S. Cl.
 CPC .......... *G11C 29/4401* (2013.01); *G11C 29/808* (2013.01)
 USPC ...... 365/200; 365/201; 365/185.09; 714/718; 714/E11.169

(58) Field of Classification Search
 None
 See application file for complete search history.

(56) References Cited

U.S. PATENT DOCUMENTS

| 5,795,797 A * | 8/1998 | Chester et al. ............... 438/4 |
| 2004/0246796 A1 * | 12/2004 | Konuk et al. ............. 365/200 |

* cited by examiner

*Primary Examiner* — James G Norman
(74) *Attorney, Agent, or Firm* — Lowe Hauptman & Ham, LLP

(57) ABSTRACT

A method for repairing a memory includes running a built-in self-test of the memory to find faulty bits. A first repair result using a redundant row block is calculated. A second repair result using a redundant column block is calculated. The first repair result and the second repair result are compared. A repair method using either the redundant row block or the redundant column block is selected. The memory is repaired by replacing a row block having at least one faulty bit with the redundant row block or replacing a column block having at least one faulty bit with the redundant column block.

20 Claims, 3 Drawing Sheets

BUILT-IN SELF REPAIR FOR MEMORY

BACKGROUND

Some conventional memory repair methods have low success rates, thus resulting in limited memory yield. Row-first repair methods (replacing faulty rows first) and/or column-first repair methods (replacing faulty columns first) are relatively simple and have relatively less timing penalties. However, those methods cannot repair some defective memories that can be repaired by other redundancy arrangements. On the other hand, complex repair methods (e.g., using a row-first repair method, then replacing it with a column-first repair method if not successful, etc.) incur expensive testing costs and need longer run times to finish the repair. Accordingly, new circuits and methods are desired to solve the above problems.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
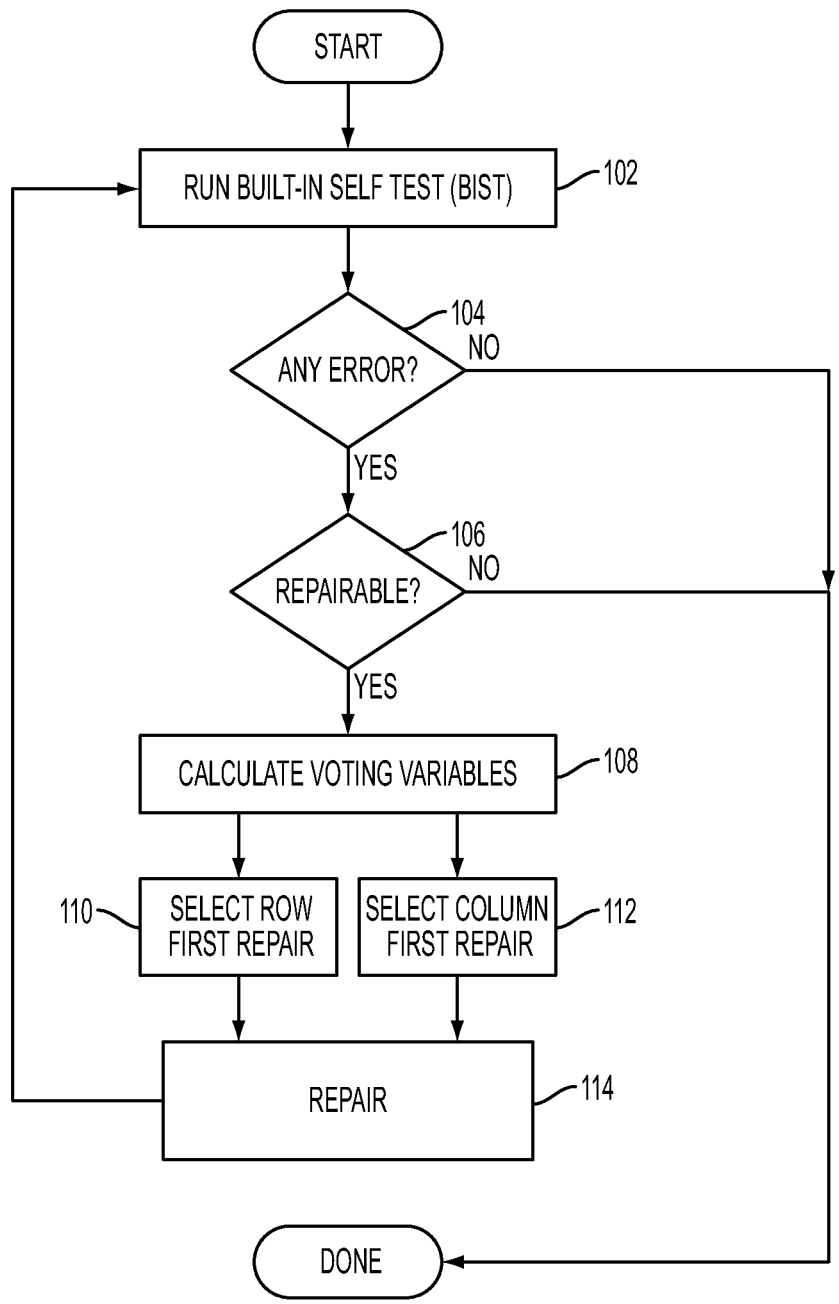
FIG. 1 is a flowchart of a built-in self repair (BISR) method for a memory according to some embodiments.
Figure 2:
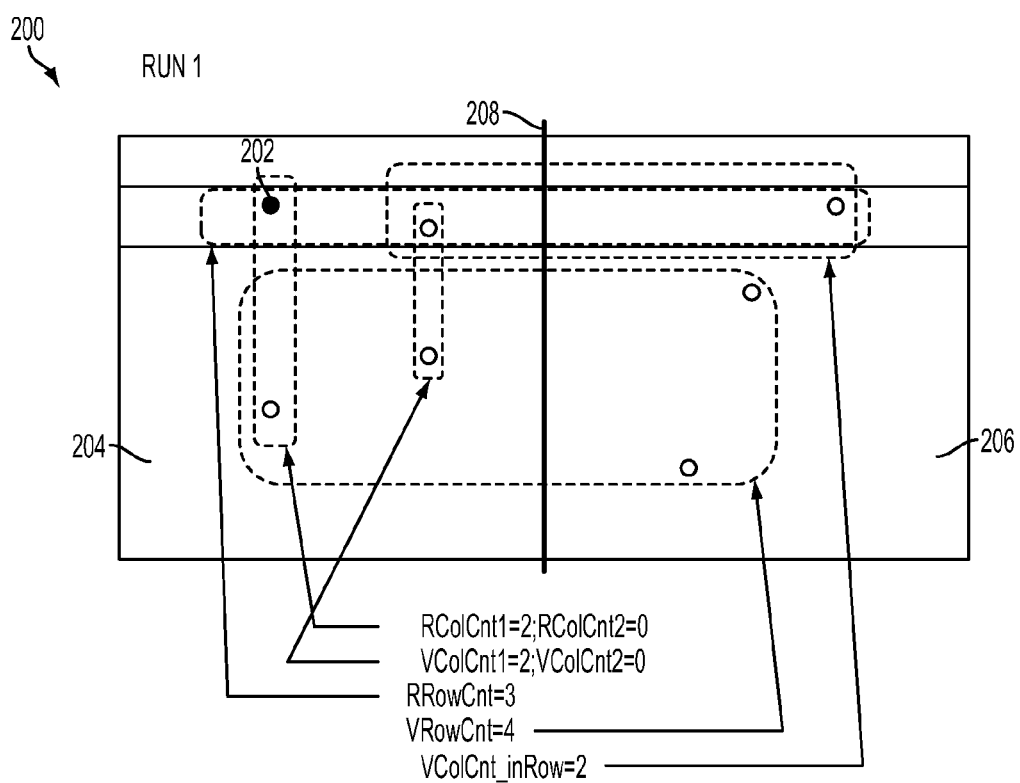
FIG. 2 is a schematic diagram showing a memory with faulty bits after the first run of a built-in self-test (BIST) for the BISR method in FIG. 1 according to some embodiments.

FIG. 1 is a flowchart of a built-in self-repair (BISR) method for a memory according to some embodiments. At step 102, a built-in self-test (BIST) executes to check the memory under testing. The BIST checks all memory cells (bits) in the memory and if any faulty bit (error) is found, creates a map (or index) of faulty bits, such as shown in FIG. 2. At step 104, if there is no error, the process is finished. If there is any error, the process continues to step 106.

At step 106, the BISR method determines if the faulty bits can be repaired. If the faulty bits cannot be repaired, the process is finished. If the faulty bits can be repaired, voting variables are calculated at step 108 before making a decision to select a row-first repair or a column-first repair method. The voting variables are used to estimate possible repair results using each method, and the details of exemplary voting variables are described below for FIG. 2.

Based on the calculated voting variables, one of the row-first repair or the column-first repair methods is selected at steps 110 or 112. For example, row-first repair and column-first repair methods are compared to select the best repair method. In some embodiments, a first faulty bit, e.g., a faulty bit located at the lowest row/column number, is considered first. Then all potentially remaining faulty bits, after a row repair or a column repair that includes the first faulty bit, are calculated. And the calculated faulty bits are used to calculate the weight of each solution by voting mechanism and compared to select one repair method.

For example, the number of all the remaining faulty bits are compared for the row repair method and the column repair method, each including the first faulty bit. A method with the least number of faulty bits remaining is selected. If both methods result in the same number of remaining faulty bits, then a default method is chosen (e.g., user defined, available redundant row/column, or randomly selected, etc.).

At step 110, a row first repair method is selected to replace the row including at least some of the faulty bits. At step 112, a column first repair method is selected to replace the column including at least some of the faulty bits. After a row first or a column first repair method is selected at either step 110 or 112, then the faulty bits in the memory are repaired using the selected method at step 114. If there are no more redundant (spare) columns and rows to replace the faulty column or row, the memory cannot be repaired.

The memory repair is performed by replacing either the row or the column containing the faulty bits by a redundant (spare) row or column, if available. In some embodiments, a pair of rows or columns (or any number of rows or columns) can be replaced as a unit, e.g., a row block or a column block (that includes at least one row or column). After the repair is finished, the process returns to step 102 and executes the BIST again to check the memory and find the remaining faulty bits, if they still exist. This process continues until the remaining faulty bits are all repaired or the memory cannot be repaired (the memory may be discarded). More details of exemplary methods according to FIG. 1 are described below, including a pseudo code.

FIG. 2 is a schematic diagram showing a memory 200 with faulty bits (circles) after the first run of a built-in self-test (BIST) for the BISR method in FIG. 1 according to some embodiments. The exemplary memory 200 includes a left half 204 and a right half 206, divided at the input/output (TO) connections 208. Redundant columns for the left half 204 and right half 206 can be separately implemented, e.g., to the left edge and right edge of the memory 200.

Depending on the memory's redundant (spare) row and column implementations, a pair of rows and/or a pair of columns can be treated as a replacement unit, and in this case the row pair (row block) or column pair (column block) that includes faulty bits are repaired as one unit. In the memory 200, two rows are paired as a unit for replacement purposes, thus regarded as one row block.

After finding the faulty bits (circles) in the memory at step 102 using BIST, voting variables as defined below are calculated, e.g., by using register counters. A first faulty bit 202 (black circle), e.g., a faulty bit located at the lowest row/column number, is considered first.

The voting variables are: (1) Related Row Count (RRowCnt), which is the total number of faulty bits in the same row (block) of the first faulty bit 202; (2) Violation Row Count (VRowCnt), which is the number of faulty bits outside the same row (block) of the first faulty bit 202; (3) Related Column Count (RColCnt1, RColCnt2), which is the total number of faulty bits in the same column (block) of the first faulty bit 202, and there are two counts in this case, RColCnt1 for the left half 204 and RColCnt2 for the right half 206 of the memory respectively; (4) Violation Column Count (VColCnt1, VColCnt2), which is the number of faulty bits outside the column (block) of the first faulty bit 202, and there are two counts in this case, VColCnt1 for the left half 204, and VColCnt2 for the right half 206 of the memory respectively; (5) Violation Column Count in Row (VColCnt_in Row), which is the number of faulty bits outside the column (blocks) but inside the same row (block) of the first faulty bit 202.

For the memory 200, it is assumed that redundant columns for the left half 204 are used only for the left half 204, and redundant columns for the right half 206 are used only for the right half 206. The variables described above are calculated from the perspective of the first faulty bit 202 as follows: (1) RRowCnt is 3, because there are 3 faulty bits in the same row block of the first faulty bit 202; (2) VRowCnt is 4, because there are 4 faulty bits outside the same row block as the first faulty bit 202; (3) RColCnt1 is 2, because there are 2 faulty bits in the same column block of the first faulty bit 202, and RColCnt2 is 0, because the first faulty bit 202 is located in the left half 204; (4) VColCnt1 is 2, because there are 2 faulty bits outside the same column block of the first faulty bit 202 on the left half 204, and VColCnt2 is 0, because the first faulty bit 202 is located in the left half 204; (5) VColCnt_in Row is 2, because there are 2 faulty bits in the same row block and outside the column block of the first faulty bit 202.

The decision of which repair methods, e.g., row-first repair or column-first repair, are used is determined by the following pseudo code process in one embodiment.

Cnt_in Row is 2), a row repair method is selected in step 110 after the first run of BIST at step 102, and the first repair is carried out at step 114. After the first repair, the BISR process returns to BIST at step 102 for a second run.

Figure 3:
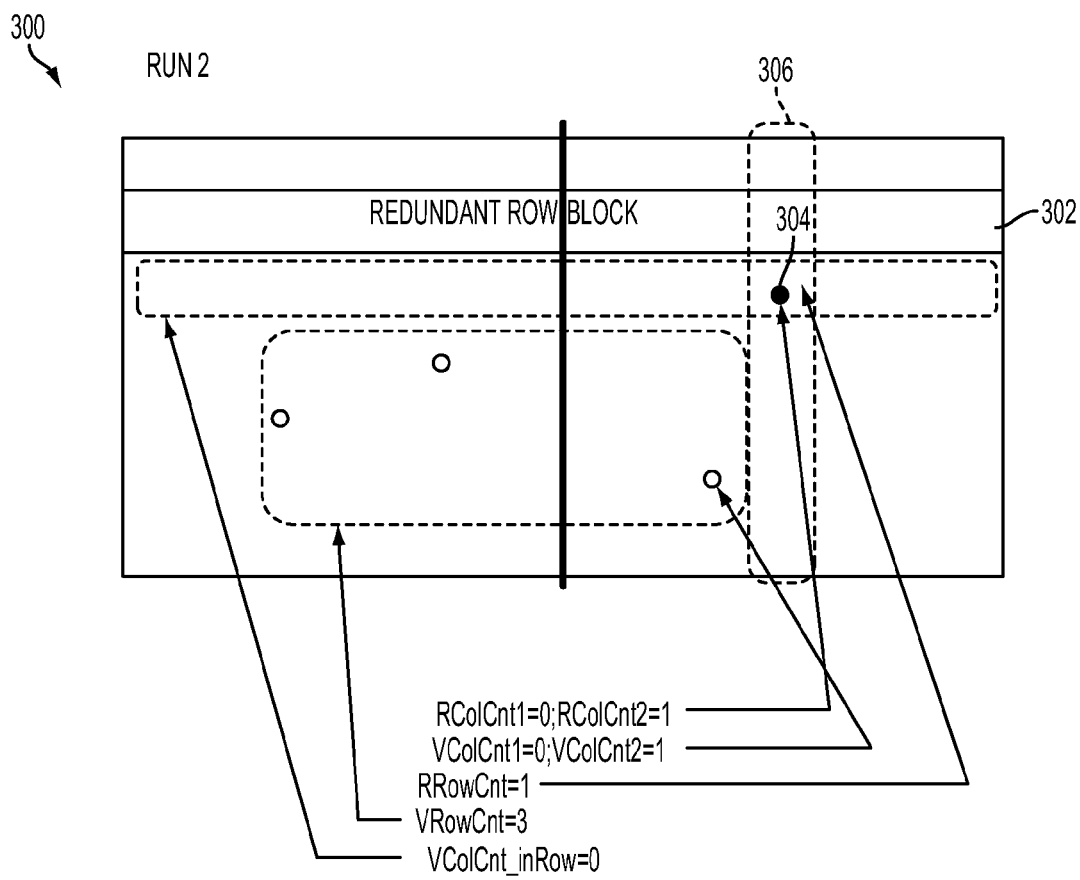
FIG. 3 is a schematic diagram showing the memory with faulty bits after the second run of the built-in self-test (BIST) for the BISR method of in FIG. 1 according to some embodiments.

FIG. 3 is a schematic diagram showing the memory with faulty bits after the second run of the built-in self-test (BIST) for the BISR method of in FIG. 1 according to some embodiments. The memory 300 shows that the row block including the first faulty bit 202 in FIG. 2 is replaced by a redundant (spare) row block 302 (e.g., through rearrangement of electrical connections, not necessarily by physical replacement). The second run of BIST shows the new first faulty bit 304 and other remaining faulty bits after the first repair, and the voting variables are updated as the following: (1) RRowCnt=1; (2) VRowCnt=3; (3) RColCnt1=0; RColCnt2=1; (4) VColCnt1=0; VColCnt2=1; (5) VColCnt_in Row=0.

Based on the voting variable values, a column repair is selected at step 112 to replace the column block 306 that includes the new first faulty bit 304, since VRowCnt>(VColCnt1+VColCnt2) from the pseudo code above. After the second repair is carried out at step 114, the BISR process returns to BIST at step 102 for a third run, and after a third repair,

```
    If VColCnt_inRow == 0 {There is no other violation (faulty) column block inside the
row block of the first faulty bit.}
        If (RColCnt1+RColCnt2) == RRowCnt {There is a single faulty bit or multiple
faulty bits present in the column block inside the first faulty bit row block.}
            If VRowCnt < (VColCnt1+VColCnt2) {The repair result will have less faulty bits
remaining by row replacement than column replacement}
                Row repair
            If VRowCnt > (VColCnt1+VColCnt2) {The repair result will have more faulty
bits remaining by row replacement than column replacement}
                Column repair
            If (RRowCnt > 1) {There are more than one faulty bits in the first faulty bit
column block.}
                If row first repair method is default then row repair; else column repair
{Follow default repair method}
            Else {There is a single faulty bit present.}
                If row first repair method is default then row repair; else column repair
{Follow default repair method}
        Else If RRowCnt < (RColCnt1+RColCnt2) {The repair result will correct less faulty
bits by row replacement than column replacement}
            Column repair
        Else {The repair result will correct more faulty bits by row replacement than column
replacement.}
            Row repair
    Else {There is another column block with at least one faulty bit inside the first faulty bit
row block.}
        Row repair
```

The above pseudo code first determines whether there is any other faulty column block (i.e., other than the first faulty bit column block) inside the first faulty bit row block and if so, the first faulty bit row block is repaired. If not, then the code compares whether the row repair or the column repair including the first faulty bit can repair more faulty bits and selects the repair method that will fix more faulty bits. If it is determined during the process that both repair methods can fix the same number of faulty bits, then a default priority method is selected, e.g., a row-first repair, or a column-first repair method.

The above pseudo code is one exemplary implementation, and there can be many variations, e.g., if there is at least one faulty bit outside the first faulty bit column block, the row repair or column repair options can be compared to select a method that repairs more faulty bits, instead of selecting the row repair method. Simplicity, speed, repair success rate, and efficiency of the BISR among other criteria can be considered when implementing embodiments of the BISR method.

Based on the above description of the pseudo code and the values of calculated voting variables for FIG. 2 (e.g., VColreturns for a fourth run, etc., until all faulty bits are repaired, or the memory runs out of redundant rows and columns and cannot repair the memory.

According to exemplary memory repair tests, one embodiment of the disclosed BISR method successfully repaired a faulty memory in about 131 ms, using 2 redundant columns and 8 redundant rows. In comparison, a conventional column first method repaired the same faulty memory in about 125 ms, using 3 redundant columns and 8 redundant rows, while an exemplary complex repair method repaired in 713 ms, using 3 redundant columns and 8 redundant rows. Other conventional methods, e.g., a row-only method, a column-only method, and a row-first method failed to repair the same faulty memory. Thus, the exemplary BISR method was the most efficient in using the least number of redundant rows and columns, and also was much faster than the tested complex repair method.

Regarding the disclosed BISR method's test repair speed of 131 ms compared to the 125 ms of the conventional column first method, the time measurement resolution of the automatic testing equipment used was not high enough to precisely determine the time differences, and another test with more precise time measurement was performed. In this test, the column first method's inter-die repair time was 1.103 ms, using 3 columns and 4 rows. In comparison, the disclosed BISR method's inter-die repair time was 0.966 ms, using 2 columns and 3 rows. Therefore, the disclosed BISR method's repair time was less than the tested column-first method.

Because the disclosed BISR method repairs the test memory while many prior known repair methods fail to repair it, the disclosed BISR method provides a higher repair rate. Also, the disclosed BISR method's run time is less than the tested complex repair method, row-first repair method, and column-first repair method, and also is more efficient than other methods because it uses less redundant (spare) rows and/or columns for the repair.

According to some embodiments, a method for repairing a memory includes running a built-in self test of the memory to find faulty bits. A first repair result using a redundant row block is calculated. A second repair result using a redundant column block is calculated. The first repair result and the second repair result are compared. A repair method using either the redundant row block or the redundant column block is selected. The memory is repaired by replacing a row block having at least one faulty bit with the redundant row block or replacing a column block having at least one faulty bit with the redundant column block.

According to some embodiments, a memory has a built-in self-repair (BISR) circuit that is capable of performing a set of operations. The set of operations includes: running a built-in self test of the memory to find faulty bits; calculating a first repair result using a redundant row block; calculating a second repair result using a redundant column block; comparing the first repair result and the second repair result; selecting a repair method using either the redundant row block or the redundant column block; and repairing the memory by replacing a row block having at least one faulty bit with the redundant row block or replacing a column block having at least one faulty bit with the redundant column block.

According to some embodiments, a computer-readable storage medium has instructions stored thereon. The instructions, when executed by a processor, cause the processor to perform the operations of: running a built-in self test of the memory to find faulty bits; calculating a first repair result using a redundant row block; calculating a second repair result using a redundant column block; comparing the first repair result and the second repair result; selecting a repair method using either the redundant row block or the redundant column block; and repairing the memory by replacing a row block having at least one faulty bit with the redundant row block or replacing a column block having at least one faulty bit with the redundant column block.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, their order changed, and/or eliminated as appropriate, in accordance with the spirit and scope of embodiments of the disclosure. Embodiments that combine different claims and/or different embodiments are within scope of the disclosure and will be apparent to those skilled in the art after reviewing this disclosure.

What is claimed is:

1. A method for repairing a memory comprising:
    running a built-in self test of the memory to find faulty bits;
    selecting a first faulty bit of the faulty bits;
    calculating a first repair result using a redundant row block after selecting the first faulty bit, wherein calculating the first repair results comprises determining a number of faulty bits not impacted using the redundant row block;
    calculating a second repair result using a redundant column block after selecting the first faulty bit, wherein calculating the second repair results comprises determining a number of faulty bits not impacted using the redundant column block, wherein at least one of the number of faulty bits not impacted using the redundant column block or the number of faulty bits not impacted using the redundant row blow is greater than zero;
    comparing the first repair result and the second repair result;
    selecting a repair method using either the redundant row block or the redundant column block; and
    repairing the memory by replacing a row block having the first faulty bit with the redundant row block or replacing a column block having the first faulty bit with the redundant column block.

2. The method of claim 1, further comprising generating a faulty bit map of the faulty bits in the memory.

3. The method of claim 1, wherein selecting the first faulty bit comprises selecting a faulty bit of the faulty bits having a lowest row number or a lowest column number.

4. The method of claim 3, wherein the first repair result is based on replacing a row block including the first faulty bit.

5. The method of claim 3, wherein the second repair result is based on replacing a column block including the first faulty bit.

6. The method of claim 1, wherein calculating the first repair result comprises counting a number of faulty bits that can be repaired by using the redundant row block.

7. The method of claim 1, wherein calculating the second repair result comprises counting a number of faulty bits that can be repaired by using the redundant column block.

8. The method of claim 1, further comprising determining whether the faulty bits can be repaired.

9. A memory having a built-in self-repair (BISR) circuit that is configured to perform a set of operations, the set of operations comprising:
    running a built-in self test of the memory to find faulty bits;
    selecting a first faulty bit of the faulty bits;
    calculating a first repair result using a redundant row block after selecting the first faulty bit;
    calculating a second repair result using a redundant column block after selecting the first faulty bit;
    comparing the first repair result and the second repair result;
    selecting a repair method using either the redundant row block or the redundant column block; and repairing the memory by replacing a row block having the first faulty bit with the redundant row block or replacing a column block having the first faulty bit with the redundant column block, wherein selecting the repair method comprises selecting the repair method which results in a fewest number of remaining faulty bits after repairing the memory, and the fewest number of remaining faulty bits after repairing the memory is greater than zero.

10. The memory of claim 9, wherein the set of operations further comprises generating a faulty bit map of the faulty bits in the memory.

11. The memory of claim 9, wherein selecting the first faulty bit comprises selecting a faulty bit of the faulty bits having a lowest row number or a lowest column number.

12. The memory of claim 11, wherein the first repair result is based on replacing a row block including the first faulty bit.

13. The memory of claim 11, wherein the second repair result is based on replacing a column block including the first faulty bit.

14. The memory of claim 9, wherein calculating the first repair result comprises counting a number of faulty bits that can be repaired by using the redundant row block.

15. The memory of claim 9, wherein calculating the second repair result comprises counting a number of faulty bits that can be repaired by using the redundant column block.

16. The memory of claim 9, wherein the set of operations further comprises determining whether the faulty bits can be repaired.

17. A computer-readable storage medium having instructions stored thereon, the instructions when executed by a processor causing the processor to perform operations of:

running a built-in self test of the memory to find faulty bits;
selecting a first faulty bit of the faulty bits; calculating a first repair result using a redundant row block after selecting the first faulty bit, wherein calculating the first repair results comprises determining a number of faulty bits not impacted using the redundant row block;
calculating a second repair result using a redundant column block after selecting the first faulty bit, wherein calculating the second repair results comprises determining a number of faulty bits not impacted using the redundant column block, wherein at least one of the number of faulty bits not impacted using the redundant column block or the number of faulty bits not impacted using the redundant row blow is greater than zero;
comparing the first repair result and the second repair result;
selecting a repair method using either the redundant row block or the redundant column block; and
repairing the memory by replacing a row block having the first faulty bit with the redundant row block or replacing a column block having the first faulty bit with the redundant column block, wherein repairing the memory comprises iteratively repairing the memory until the number of faulty bits not impacted using the redundant column block and the number of faulty bits not impacted using the redundant row blow is zero.

18. The computer-readable storge medium of claim 17, wherein the instructions when executed further cause the processor to perform an operation of generating a faulty bit map of the faulty bits in the memory.

19. The computer-readable storage medium of claim 17, wherein the instructions when executed further cause the processor to perform an operation of selecting the first faulty bit by selecting a faulty bit of the faulty bits having a lowest row number or a lowest column number.

20. The computer-readable storage medium of claim 19, wherein the first repair result is based on replacing a row block including the first faulty and the second repair result is based on replacing a column block including the first faulty bit.

* * * * *